United States Patent
Marchand

(10) Patent No.: US 7,528,592 B2
(45) Date of Patent: May 5, 2009

(54) MAGNETORESISTIVE SENSOR FOR CURRENT SENSING

(75) Inventor: David Gregory Marchand, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 49 days.

(21) Appl. No.: 11/443,093

(22) Filed: May 31, 2006

(65) Prior Publication Data

US 2007/0296399 A1    Dec. 27, 2007

(51) Int. Cl.
G01R 15/18    (2006.01)
(52) U.S. Cl. .................................. 324/117 R
(58) Field of Classification Search ............. 324/117 H, 324/117 R, 126, 127, 158.1; 702/85–88
See application file for complete search history.

(56) References Cited

U.S. PATENT DOCUMENTS

| | | | | |
|---|---|---|---|---|
| 1,929,714 | A * | 10/1933 | Reich | .......................... 324/115 |
| 4,385,273 | A | 5/1983 | Lienhard et al. | |
| 4,385,283 | A | 5/1983 | Delapierre | |
| 4,464,625 | A | 8/1984 | Lienhard et al. | |
| 4,525,668 | A * | 6/1985 | Lienhard et al. | ............. 324/142 |
| 4,857,837 | A | 8/1989 | Baran et al. | |
| 4,935,693 | A * | 6/1990 | Falkowski et al. | ............ 324/127 |
| 4,937,521 | A * | 6/1990 | Yoshino et al. | ......... 324/117 R |
| 5,247,278 | A | 9/1993 | Pant et al. | |
| 5,933,003 | A | 8/1999 | Hebing et al. | |
| 5,952,825 | A | 9/1999 | Wan | |
| 6,320,369 | B1 * | 11/2001 | Hidaka et al. | ............ 324/117 R |
| 6,356,851 | B1 | 3/2002 | Young et al. | |
| 6,433,545 | B1 | 8/2002 | Kunze et al. | |
| 6,642,705 | B2 * | 11/2003 | Kawase | ................... 324/117 R |
| 6,731,105 | B1 * | 5/2004 | Hoyle et al. | ............. 324/117 R |
| 6,872,467 | B2 | 3/2005 | Qian et al. | |
| 6,949,927 | B2 | 9/2005 | Goetz | |
| 2004/0155644 | A1 | 8/2004 | Stauth et al. | |
| 2006/0061350 | A1 | 3/2006 | Myers et al. | |
| 2007/0279052 | A1 | 12/2007 | Marchand | |

FOREIGN PATENT DOCUMENTS

WO    WO 99/06844    2/1999

OTHER PUBLICATIONS

Honeywell, "Set/Reset Function for Magnetic Sensors," printed from the internet on Apr. 10, 2006, pp. 1-8.
Honeywell, "Handling Sensor Bridge Offset," printed from the internet on Apr. 10, 2006, pp. 1-6.

(Continued)

*Primary Examiner*—Ha Tran T Nguyen
*Assistant Examiner*—Richard Isla Rodas
(74) *Attorney, Agent, or Firm*—Finnegan, Henderson, Farabow, Garrett & Dunner

(57) ABSTRACT

A system for sensing current in one or more first electrical conductors includes a frame and a retainer configured to receive the one or more first electrical conductors and constrain relative movement between the one or more first electrical conductors and the frame. The system may also include a first magnetoresistive sensor configured to sense magnetic flux and generate an output signal relating to the sensed magnetic flux. Additionally, the system may include an adjustable positioning system configured to enable supporting the first magnetoresistive sensor from the frame in any of a plurality of possible positions with respect to the retainer.

32 Claims, 6 Drawing Sheets

OTHER PUBLICATIONS

Honeywell, "1-and 2-Axis Magnetic Sensors," printed from the internet on Apr. 10, 2006, pp. 1-15.

Honeywell, "Magnetic Current Sensing," printed from the internet on Apr. 10, 2006, pp. 1-7.

Olson, E.R. et al: "Using the Dynamic Behavior of Superimposed Fields for Point Field-Based Current Sensing". Applied Power Electronics Conference & Exposition, 2006. 21st Annual IEEE Mar. 19, 2006, Piscataway, NJ, pp. 580-586, XP010910003. ISBN 0-7803-9547-6.

Duron, J. et al: "Dynamic Field Mapping for Obtaining the Current Distribution in High-Temperature Superconducting Tapes". IEEE Transactions on Applied Superconductivity, IEEE Service Center, Los Alamitos, CA, vol. 15, No. 2, Jun. 2005, pp. 3644-3647, XP011134476. ISSN: 1051-8223.

* cited by examiner though one or more electrical conductors. Some electrical systems sense the electric current in an electrical conductor with a magnetoresistive sensor that senses the magnetic flux produced by the electric current and produces an output signal related to the magnitude of the magnetic flux and, thus, the magnitude of the electric current. Unfortunately, a magnetoresistive sensor may be able to accurately sense only a limited range of magnetic flux intensity. As a result, many electrical systems that employ a magnetoresistive sensor for current sensing are able to accurately sense only a limited range of electric current using the magnetoresistive sensor.

MAGNETORESISTIVE SENSOR FOR CURRENT SENSING

TECHNICAL FIELD

The present disclosure relates to electrical systems and, more particularly, to electrical systems utilizing magnetoresistive sensing.

BACKGROUND

Electrical systems transmit electric current through electrical conductors in order to perform many tasks. Many applications of electrical systems may require sensing of the magnitude of electric current flowing through one or more electrical conductors. Some electrical systems sense the electric current in an electrical conductor with a magnetoresistive sensor that senses the magnetic flux produced by the electric current and produces an output signal related to the magnitude of the magnetic flux and, thus, the magnitude of the electric current. Unfortunately, a magnetoresistive sensor may be able to accurately sense only a limited range of magnetic flux intensity. As a result, many electrical systems that employ a magnetoresistive sensor for current sensing are able to accurately sense only a limited range of electric current using the magnetoresistive sensor.

U.S. Pat. No. 4,525,668 to Lienhard et al. ("the '668 patent") shows a current-sensing method that includes sensing magnetic flux from both an unknown current and a control current with a magnetoresistive sensor, while using the control current to maintain the total magnetic flux sensed by the magnetoresistive sensor substantially equal to zero. The '668 patent discloses an electrical system that includes a first electrical conductor carrying the unknown current adjacent the magnetoresistive sensor. A second electrical conductor disposed adjacent the magnetoresistive sensor carries the controlled current. The electrical system of the '668 patent further includes an operational amplifier connected between the magnetoresistive sensor and the second electrical conductor. The operational amplifier receives the output signal of the magnetoresistive sensor and controls the magnitude of the control current in the second electrical conductor in such a manner that magnetic flux from the control current substantially cancels magnetic flux from the unknown current at the magnetoresistive sensor. The electrical system of the '668 patent includes additional analog components that use the control current to generate a signal indicative of the magnitude of the unknown current.

Although the system of the '668 patent includes provisions for sensing electric current with a magnetoresistive sensor while using control current to control the total magnetic flux sensed by the magnetoresistive sensor, certain disadvantages persist. For example, the magnetoresistive sensor may be undesirably close to the first electrical conductor for applications and/or circumstances wherein current in the first electrical conductor is large, while being undesirably far from the from the first electrical conductor for applications and/or circumstances wherein the current in the first magnetic conductor is small. In applications and/or circumstances wherein the current in the first electrical conductor is large, the flux from that current may be undesirably strong at the magnetoresistive sensor. In such circumstances, it may be difficult to generate sufficient magnetic flux with the control current to cancel the magnetic flux from the current in the first electrical conductor. Conversely, in applications and/or circumstances wherein the current in the first electrical conductor is small, the flux from the current in the first electrical conductor may be undesirably weak at the magnetoresistive sensor. In such circumstances, it may be possible to sense the current in the first electrical conductor with only relatively low precision.

The electrical systems and methods of the present disclosure solve one or more of the problems set forth above.

SUMMARY OF THE INVENTION

One disclosed embodiment relates to a system for sensing current in one or more first electrical conductors. The system may include a frame and a retainer configured to receive the one or more first electrical conductors and constrain relative movement between the one or more first electrical conductors and the frame. The system may also include a first magnetoresistive sensor configured to sense magnetic flux and generate an output signal relating to the sensed magnetic flux. Additionally, the system may include an adjustable positioning system configured to enable supporting the first magnetoresistive sensor from the frame in any of a plurality of possible positions with respect to the retainer.

Another embodiment relates to a method of sensing current in one or more first electrical conductors. The method may include supporting a first magnetoresistive sensor from a frame, including using an adjustable positioning system to locate the first magnetoresistive sensor in one of a plurality of possible positions with respect to the frame. The method may also include constraining relative movement between the one or more first electrical conductors and the frame. Additionally, the method may include using the first magnetoresistive sensor to sense magnetic flux and generate an output signal relating to the sensed magnetic flux, which may include using the first magnetoresistive sensor to sense magnetic flux generated by current in the one or more first electrical conductors.

DETAILED DESCRIPTION

Figure 1:
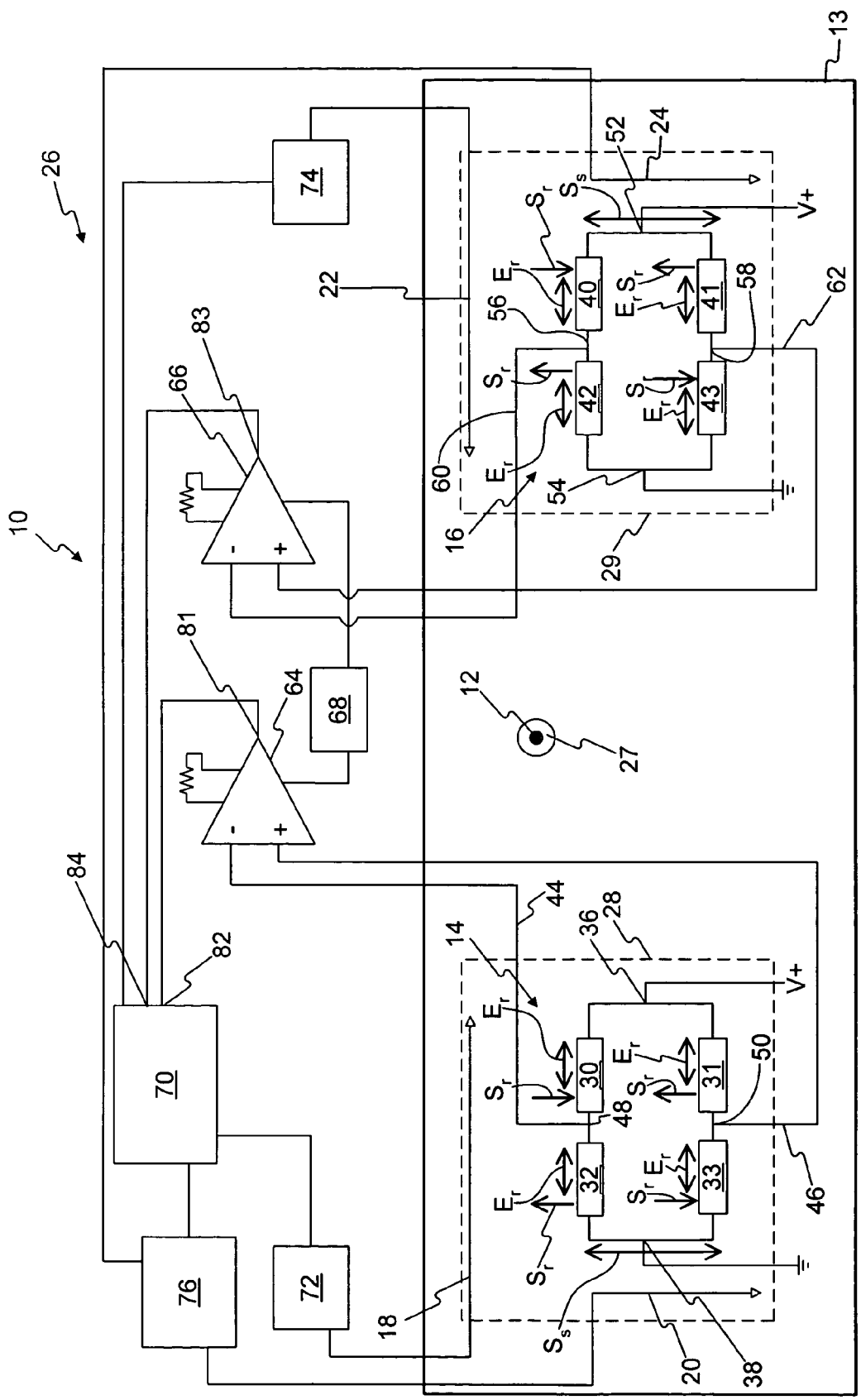
FIG. 1 is a schematic illustration of a first embodiment of an electrical system according to the present disclosure.

FIG. 1 illustrates one embodiment of an electrical system 10 according to the present disclosure. Electrical system 10 may include an electrical conductor 12, a frame 13, a retainer 27, magnetoresistive sensors 14, 16, electrical conductors 18, 20, 22, 24, and a control circuit 26. Electrical conductor 12 may be any type of structure configured to carry electrical current, including, but not limited to, a wire, a bus bar, and a trace in a monolithic integrated circuit.

Retainer 27 may be any feature or structure configured to hold electrical conductor 12 in a predetermined position with respect to frame 13. As FIG. 1 shows, in some embodiments, retainer 27 may be an aperture in frame 13.

Magnetoresistive sensors 14, 16 and electrical conductors 18, 20, 22, 24 may be mounted to frame 13. Magnetoresistive sensors 14, 16 may be substantially equidistant from electrical conductor 12. Electrical conductors 18, may be disposed proximate magnetoresistive sensor 14, and electrical conductors 22, 24 may be disposed proximate magnetoresistive sensor 16. As FIG. 1 shows, in some embodiments, magnetoresistive sensor 14, electrical conductor 18, and electrical conductor 20 may be part of a monolithic integrated circuit 28. Similarly, magnetoresistive sensor 16, electrical conductor 22, and electrical conductor 24 may be part of a monolithic integrated circuit 29.

Each magnetoresistive sensor 14, 16 may be any type of component having at least one magnetoresistor connected to at least one other electrical circuit element in a manner enabling the magnetoresistive sensor 14, 16 to sense magnetic flux and produce an output signal relating to the sensed magnetic flux. As FIG. 1 shows, in some embodiments, each magnetoresistive sensor may include a plurality of magnetoresistors 30, 31, 32, 33 and 40, 41, 42, 43. Each magnetoresistor 30-33, 40-43 may be constructed in any manner that provides a relatively strong correlation between the strength of magnetic flux flowing in a sensitive direction $S_r$ of the magnetoresistor 30-33, 40-43 and the electrical resistance of the magnetoresistor 30-33, 40-43. In some embodiments, each magnetoresistor 30-33, 40-43 may be constructed of Permalloy. Additionally, in some embodiments, each magnetoresistor 30-33, 40-43 may be constructed with "barber pole" biasing. As is shown in FIG. 1, each magnetoresistor 30-33, 40-43 may be constructed such that it has anisotropic sensitivity to magnetic flux.

As FIG. 1 shows, magnetoresistors 30-33 may be arranged in a wheatstone bridge. An input terminal 36 of the wheatstone bridge may be connected to a power source, such as a constant-voltage DC power source. An output terminal 38 of the wheatstone bridge may be connected to ground, either directly or with one or more other circuit elements connected between output terminal 38 and ground. The "easy" axes $E_r$ and sensitive directions $S_r$ of magnetoresistors 30-33 may be oriented so that a sensitive direction $S_s$ of magnetoresistive sensor 14 extends at an angle to electrical conductor 12. As shown in FIG. 1, in some embodiments, the sensitive directions $S_r$ of magnetoresistors 30 and 33 may be substantially the same, and the sensitive directions $S_r$ of magnetoresistors 31 and 32 may be substantially the same and substantially opposite those of magnetoresistors 30 and 33. Additionally, magnetoresistors 30 and 31 may have substantially equal default electrical resistances (their electrical resistances when not exposed to magnetic flux), and magnetoresistors 32 and 33 may also have substantially equal default electrical resistances.

Additionally, magnetoresistive sensor 14 may include electrical conductors 44, 46 connected to intermediate terminals 48, 50 of the wheatstone bridge. As is discussed in more detail below, in the embodiment shown in FIG. 1, electrical conductors 44, 46 may collectively supply control circuit 26 with an output signal relating to the magnetic flux sensed by magnetoresistive sensor 14.

Similar to magnetoresistive sensor 14, magnetoresistive sensor 16 may have its magnetoresistors 40-43 arranged in a wheatstone bridge having an input terminal 52 connected to a power source, an output terminal 54 connected to ground, electrical conductors 60, 62 connected to intermediate terminals 56, 58. Additionally, as FIG. 1 shows, the sensitive directions $S_r$ of magnetoresistors 40-43 and the sensitive direction $S_s$ of magnetoresistive sensor 16 may be oriented similar to those of magnetoresistors 30-33 and magnetoresistive sensor 16.

Magnetoresistive sensors 14, 16 are not limited to the configurations shown in FIG. 1 and discussed above. For example, a magnetoresistive sensor 14, 16 may include more or less magnetoresistors than shown in FIG. 1. In some embodiments, a magnetoresistive sensor 14, 16 may include a conventional resistor in place of one or more of the magnetoresistors 30-33, 40-43 shown in FIG. 1. Additionally, in some embodiments, the magnetoresistors of a magnetoresistive sensor 14, 16 may be arranged in a different configuration of bridge than shown in FIG. 1. Furthermore, in some embodiments, the magnetoresistors of a magnetoresistive sensor 14, 16 may be arranged in a configuration other than a bridge. For example, a magnetoresistive sensor 14, 16 may include a single magnetoresistor connected in series with one or more conventional resistors. Additionally, electrical system 10 may omit one of magnetoresistive sensors 14, 16 or include additional magnetoresistive sensors not shown in FIG. 1. Furthermore, in some embodiments one or more of the magnetoresistors of magnetoresistive sensors 14, 16 may have isotropic sensitivity to magnetic flux.

Each electrical conductor 18, 20, 22, 24 may be any structure configured to carry electric current. For purposes of this disclosure, electrical conductors 18, 20, 22, 24 may all be considered control current conductors. Electrical conductor 18 may be configured such that at least a portion of magnetic flux generated by electric current in electrical conductor 18 flows at least partially in or opposite the sensitive direction $S_r$ of at least one magnetoresistor 30-33. For example, as FIG. 1 shows, in some embodiments, electrical conductor 18 may have one or more portions that extend perpendicular to the sensitive direction $S_r$ of each magnetoresistor 30-33. Electrical conductor 20 may be configured such that at least a portion of magnetic flux generated by electric current in electrical conductor 20 flows at least partially along the easy axis $E_r$ of magnetoresistors 30-33. For example, as FIG. 1 shows, in some embodiments, electrical conductor 20 may have one or more portions that extend substantially perpendicular to the easy axis $E_r$ of each magnetoresistor 30-33. Electrical conductors 22, 24 may be arranged such that magnetic flux generated by electric current in electrical conductors 22, 24 has the same relationships with respect to magnetoresistors 40-43 as the above-described relationships between magnetic flux generated by electric current in electrical conductors 18, 20 and magnetoresistors 30-33.

Control circuit 26 may be connected to magnetoresistive sensors 14, 16 and electrical conductors 18, 20, 22, 24. Control circuit 26 may include any combination of electrical circuit elements operable to receive output signals produced by magnetoresistive sensors 14, 16 and control electric current in electrical conductors 18, 20, 22, 24, as described below. As FIG. 1 shows, in some embodiments, control circuit 26 may include operational amplifiers 64, 66, a reference-voltage source 68, an information processor 70, low-pass filters 72, 74, and a flipping circuit 76. Operational amplifiers 64, 66 may have inputs connected to electrical conductors 44, 46 and electrical conductors 60, 62, respectively. Additionally, reference-voltage source 68 may provide a reference voltage, such as a substantially constant DC voltage, to an input of each operational amplifier 64, 66. Outputs 81, 83 of operational amplifiers 64, 66 may be connected to inputs 82, 84 of information processor 70. Additionally, low-pass filters 72 and 74 may be connected between outputs of information processor 70 and electrical conductors 18 and 22, respectively.

Information processor 70 may be any type of circuit operable to receive output signals from operational amplifiers 64, 66 and control supply of electric current to electrical conductors 18, 22. Information processor 70 may be a digital circuit or an analog circuit. Information processor 70 may be a monolithic integrated circuit or a collection of discrete electrical circuit elements. In some embodiments, information processor 70 may be a digital microcontroller. Information processor 70 may be operable to supply pulse-width-modulated voltage to low-pass filters 72, 74. Low-pass filters 72, 74 may, in turn, convert pulse-width-modulated voltage received from information processor 70 into DC current and supply it to electrical conductors 18, 22.

Flipping circuit 76 may be connected between an output of information processor 70 and electrical conductors 20, 24. Flipping circuit 76 may be operable to cause a pulse of electric current in each electrical conductor 20, 24 when information processor 70 activates flipping circuit 76. Additionally, flipping circuit 76 may be configured such that each pulse of current it generates in electrical conductors 20, 24 flows in a direction opposite the prior pulse of current.

Control circuit 26 is not limited to the configuration shown in FIG. 1. For example, control circuit 26 may include other electrical circuit elements in addition to, or in place of, circuit elements shown in FIG. 1. Additionally, control circuit 26 may omit some of the circuit elements shown in FIG. 1. In some embodiments, control circuit 26 may include only analog circuit elements.

Additionally, electrical system 10, generally, is not limited to the configuration shown in FIG. 1. For example, electrical system 10 may omit electrical conductor 20 and/or electrical conductor 24. Additionally, electrical system 10 may include multiple electrical conductors in place of electrical conductor 18, and/or electrical system 10 may include multiple electrical conductors in place of electrical conductor 22. Furthermore, electrical system 10 may include multiple electrical conductors in place of electrical conductor 12. Additionally, in some embodiments, electrical system 10 may omit magnetoresistive sensor 16 and electrical conductor 22.

Figure 2:
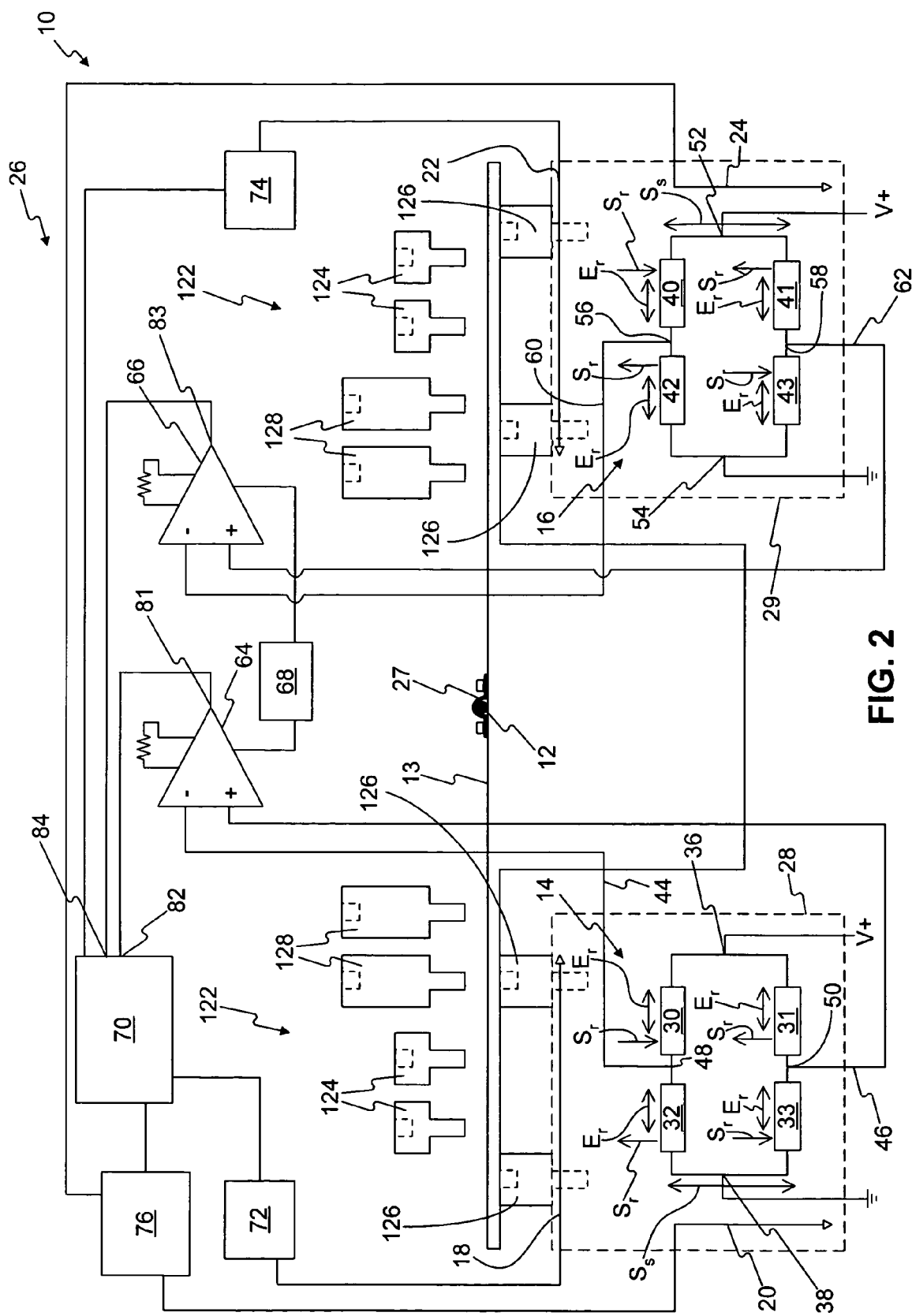
FIG. 2 is a schematic illustration of a second embodiment of an electrical system according to the present disclosure.

FIG. 2 shows another embodiment of electrical system 10. The embodiment of electrical system 10 shown in FIG. 2 may be substantially the same as the embodiment of electrical system 10 shown in FIG. 1, except for the configuration of frame 13, the configuration of retainer 27, and details regarding how monolithic integrated circuits 28, 29 are located relative to retainer 27 and electrical conductor 12. In the embodiment shown in FIG. 2, retainer 27 includes fasteners configured to clamp electrical conductor 12 to frame 13, rather than an aperture in frame 13.

Additionally, the embodiment of electrical system 10 shown in FIG. 2 includes an adjustable positioning system 122. Adjustable positioning system 122 may include any structure enabling positioning of monolithic integrated circuits 28, 29, and thus magnetoresistive sensors 14, 16, in any of a plurality of possible positions with respect to retainer 27 and electrical conductor 12. As FIG. 2 shows, in some embodiments, adjustable positioning system 122 may include a plurality of spacers 124, 126, 128 that may be mounted between frame 13 and monolithic integrated circuits 28, 29 in different combinations to locate monolithic integrated circuits 28, 29 in different positions with respect to electrical conductor 12 and retainer 27. For example, whereas FIG. 2 shows spacers 126 mounted between monolithic integrated circuits 28, 29 and frame 13, spacers 124 could be used in place of spacers 126 to put monolithic integrated circuits 28, 29 closer to electrical conductor 12. Conversely, spacers 128 may be employed to place monolithic integrated circuits 28, 29 farther from electrical conductor 12 than shown in FIG. 2. Stacking spacers 124, 126, 128 between monolithic integrated circuits 28, 29 and frame 13 may place monolithic integrated circuits 28, 29 still further from electrical conductor 12 and retainer 27.

In some embodiments, spacers 124, 126, 128 may be configured to secure monolithic integrated circuits 28, 29 to frame 13. For example, each spacer 124, 126, 128 may include threads (not shown) for attaching spacers 124, 126, 128 to monolithic integrated circuits 28, 29 and frame 13. Alternatively, spacers 124, 126, 128 may not include provisions for securing monolithic integrated circuits 28, 29 to frame 13, and other means may be used to secure monolithic integrated circuits 28, 29 to frame 13.

Spacers 124, 126, 128 are not limited to the configuration shown in FIG. 2. For example, whereas FIG. 2 shows spacers 124, 126, 128 having different lengths, spacers 124, 126, 128 may all have the same length. In such embodiments, monolithic integrated circuits 28, 29 may be located in different positions with respect to electrical conductor 12 by stacking different numbers of spacers 124, 126, 128 between monolithic integrated circuits 28, 29 and frame 13.

Figure 3:
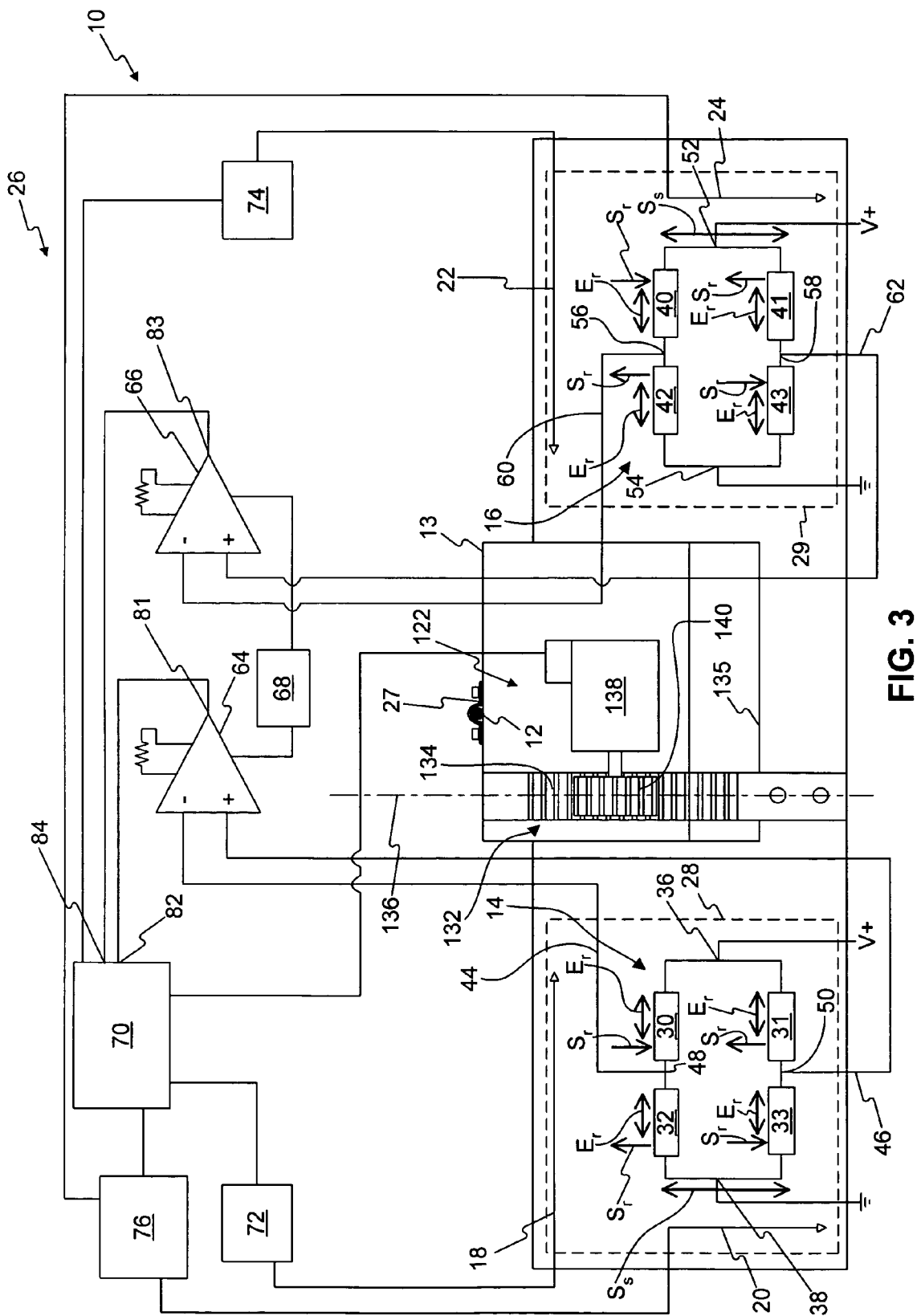
FIG. 3 is a schematic illustration of a third embodiment of an electrical system according to the present disclosure.

FIG. 3 shows another embodiment of electrical system 10. The embodiment of electrical system 10 shown in FIG. 3 may be substantially the same as the embodiment of electrical system 10 shown in FIG. 2, except for the configurations of frame 13 and adjustable positioning system 122. In the embodiment shown in FIG. 3, adjustable positioning system 122 includes a moveable connection 132 between monolithic integrated circuits 28, 29 and frame 13. As FIG. 3 shows, moveable connection 132 may be a sliding connection between frame 13 and a rack 134 connected to a frame 135 to which monolithic integrated circuits 28, 29 are mounted. Moveable connection 132 may allow rack 134 and monolithic integrated circuits 28, 29 to slide along an axis 136 with respect to frame 13.

In some embodiments, in addition to moveable connection 132, adjustable positioning system 122 may include a powered actuator 138 operable to move monolithic integrated circuits 28, 29 with respect to frame 13. Powered actuator 138 may be an electric motor drivingly connected to a pinion 140 engaged to rack 134. Information processor 70 and/or other elements of control circuit 26 may be operatively connected to powered actuator 138 so that control circuit 26 may exercise control over the positions of monolithic integrated circuits 28, 29. Additionally, or alternatively, various other control components may be operatively connected to powered actuator 138. For example, in some embodiments, there may be provisions for enabling the manual control of powered actuator 138.

Adjustable positioning system 122 is not limited to the configuration shown in FIG. 3. For example, rather than a sliding connection, moveable connection 132 may be a pivoting connection or pivoting and sliding connection. Additionally adjustable positioning system 122 may include other moveable connections between monolithic integrated circuits 28, 29 and frame 13, in addition to moveable connection 132. Furthermore, powered actuator 138 may be a type of device other than an electric motor, such as, for example, a hydraulic actuator or a pneumatic actuator. Additionally, adjustable positioning system 122 may include other powered actuators in addition to powered actuator 138. Moreover, adjustable positioning system 122 may omit powered actuator 138.

Figure 4:
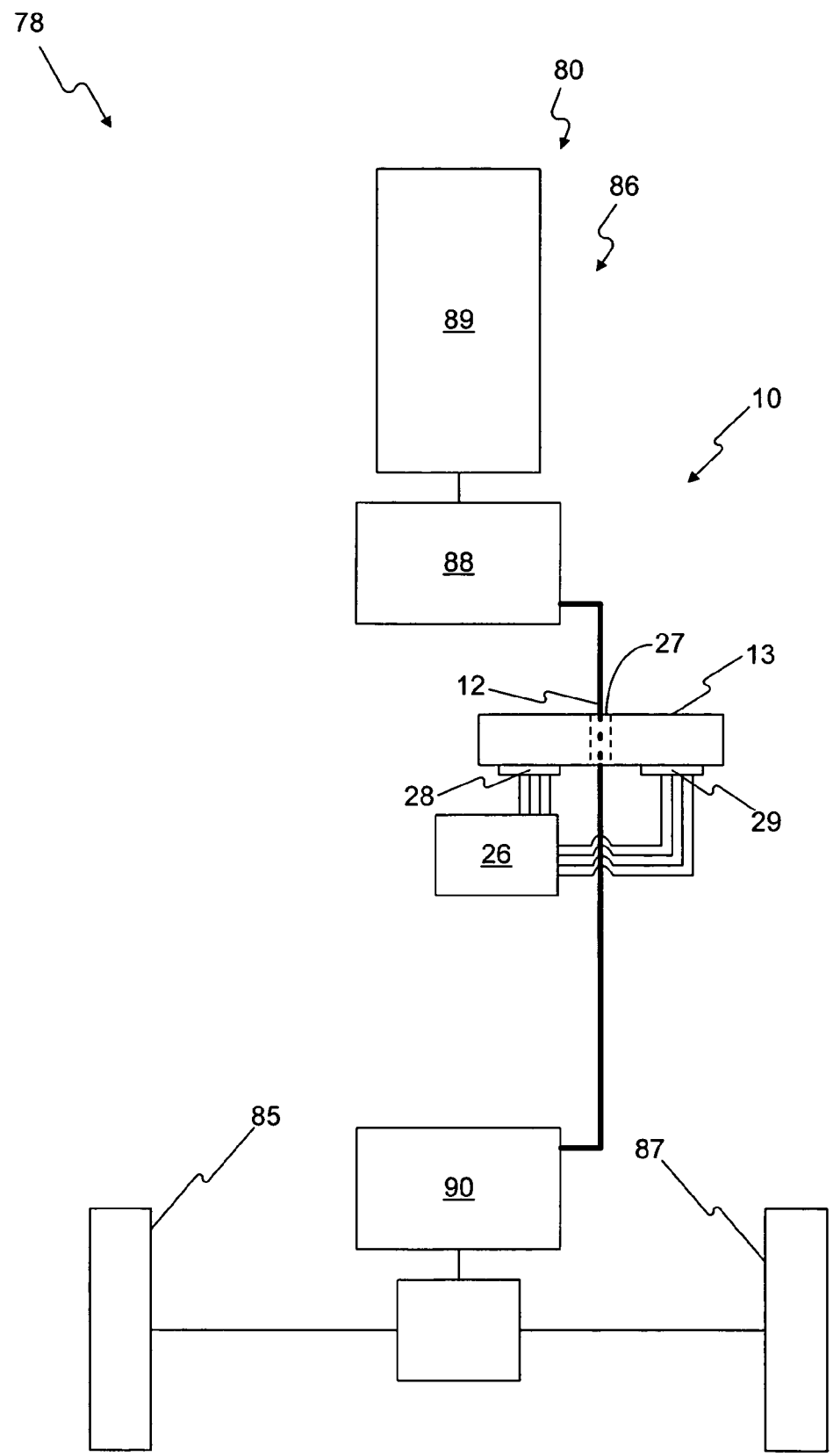
FIG. 4 is a schematic illustration of a mobile machine that includes an electrical system according to the present disclosure.

FIG. 4 shows a mobile machine 78 that includes electrical system 10. Mobile machine 78 may have a propulsion system 80 operable to propel mobile machine 78. Propulsion system 80 may include propulsion devices 85, 87 and a power-supply system 86 operatively connected to propulsion devices 85, 87. Propulsion devices 85, 87 may be any type of device configured to propel mobile machine 78 by receiving power from power-supply system 86 and transmitting at least a portion of that power to the environment surrounding mobile machine 78, including, but not limited to, wheels, track units, and propellers.

In some embodiments, such as the embodiment shown in FIG. 4, propulsion system 80 may be configured to propel mobile machine 78 at least partially with electric power, and electrical conductor 12 may be a power line of propulsion system 80. In the embodiment shown in FIG. 4, power-supply system 86 includes a prime mover 89 (such as an internal combustion engine or gas turbine), an electric motor/generator 88 drivingly connected to prime mover 89, and an electric motor/generator 90 drivingly connected to propulsion devices 85, 87. Additionally, electric motor/generator 88 and electric motor/generator 90 may be electrically connected via electrical conductor 12.

INDUSTRIAL APPLICABILITY

Electrical system 10 may have application wherever electricity is required to perform one or more tasks. Operation of electrical system 10 will be described hereinbelow.

During operation of electrical system 10, electrical conductor 12 may carry electric current between two or more components for various purposes. For example, in the implementation of electrical system 10 shown in FIG. 4, electrical conductor 12 may carry electric current from electric motor/generator 88 to electric motor/generator 90 for the purpose of providing electric motor/generator 90 with power to propel mobile machine. In many circumstances, it may be desirable to know the magnitude of electric current flowing through electrical conductor 12 for various purposes, such as for use in controlling various aspects of the operation of electrical system 10.

Figure 5:
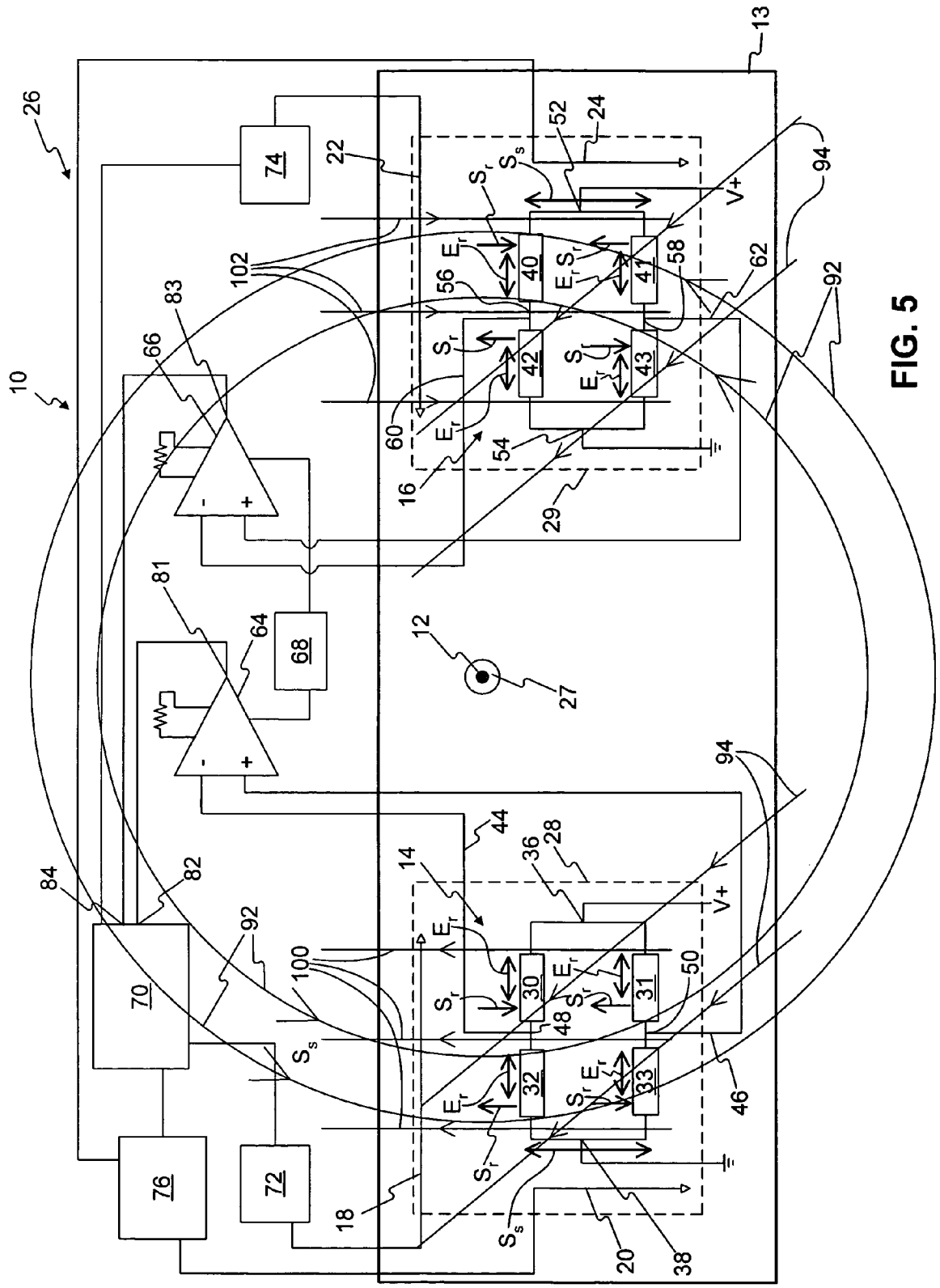
FIG. 5 shows the electrical system of FIG. 1 in operation.

When electric current flows through electrical conductor 12, magnetoresistive sensors 14, 16 may generate output signals that control circuit 26 may utilize to generate a signal relating to the magnitude of electric current flowing through electrical conductor 12. FIG. 5 shows the configuration of electrical system 10 from FIG. 1 in operation. Electric current flowing through electrical conductor 12 may generate magnetic flux 92 with a magnitude proportional to the electric current. Depending upon the direction of electric current in electrical conductor 12, magnetic flux 92 may flow counter-clockwise around electrical conductor 12 or clockwise around electrical conductor 12. When magnetic flux 92 is flowing through magnetoresistive sensors 14, 16, it may affect the electrical resistance of each of the magnetoresistors of magnetoresistive sensors 14, 16 and thereby the output signal of each magnetoresistive sensor 14, 16. The degree to which the magnetic flux 92 affects the electrical resistance of the magnetoresistors of a magnetoresistive sensor and the output of that magnetoresistor will depend upon the magnitude of magnetic flux 92 and the spatial relationship between electrical conductor 12 and the magnetoresistors.

In the circumstances shown in FIG. 5, magnetic flux 92 may affect the voltage at intermediate terminals 48, 50, 56, 58 of the wheatstone bridges of magnetoresistive sensors 14, 16. In embodiments where magnetoresistors 30-33 have equal default electrical resistances, when magnetoresistive sensor 14 is not exposed to magnetic flux, each magnetoresistor 30-33 may cause an equal voltage drop, and the voltage at intermediate terminals 48, 50 may be equal. However, when magnetic flux 92 is flowing through magnetoresistors 30-33, the electrical resistances of magnetoresistors 30-33 may vary as a function of the magnitude of magnetic flux 92. This may create a voltage differential between intermediate terminals 48, 50 proportional to magnetic flux 92. In the embodiment shown in FIG. 5, this voltage differential (or the lack thereof) constitutes the output signal of magnetoresistive sensor 14. Magnetoresistive sensor 16 may similarly respond to magnetic flux 92 with a voltage differential between intermediate terminals 56, 58, which voltage differential (or the lack thereof) is its output signal.

With magnetoresistors 14, 16 arranged as shown in FIG. 5, magnetic flux 92 will always drive the output signals of magnetoresistive sensors 14, 16 in opposite directions. This is because magnetic flux 92 flows in opposite directions with respect to the sensitive directions $S_r$ of the corresponding magnetoresistors of each magnetoresistive sensor 14, 16, such as magnetoresistor 30 and magnetoresistor 40.

Ambient magnetic flux 94, such as the magnetic flux from the Earth's magnetic poles, may also affect the electrical resistance of magnetoresistors 30-33, 40-43 and, thus, the output signals of magnetoresistive sensors 14, 16. Unlike magnetic flux 92, ambient magnetic flux 94 will generally flow through all of magnetoresistors 30-33, 40-43 in the same direction (though not necessarily the direction shown in FIG. 5). As a result, ambient magnetic flux 94 will generally add to magnetic flux 92 sensed by one of magnetoresistive sensors 14, 16 while canceling some or all of magnetic flux 92 sensed by the other magnetoresistive sensors 14, 16. In the exemplary circumstances shown in FIG. 5, ambient magnetic flux 94 will add with magnetic flux 92 sensed by magnetoresistive sensor 16, and ambient magnetic flux 94 will cancel at least a portion of magnetic flux 92 sensed by magnetoresistive sensor 14.

Control circuit 26 may perform various operations with the output signals provided by magnetoresistive sensors 14, 16. Operational amplifier 64 may subtract the voltage at intermediate terminal 48 from the voltage at intermediate terminal 50, multiply the result by the gain of operational amplifier 64, add the result to the reference voltage received from reference-voltage source 68, and output the resulting voltage from output 81 to input 82 of information processor 70. Operational amplifier 66 may perform the same operations with the voltage from intermediate terminal 56 and intermediate terminal 58, and output the result from output 83 to input 84 of information processor 70.

Figure 6:
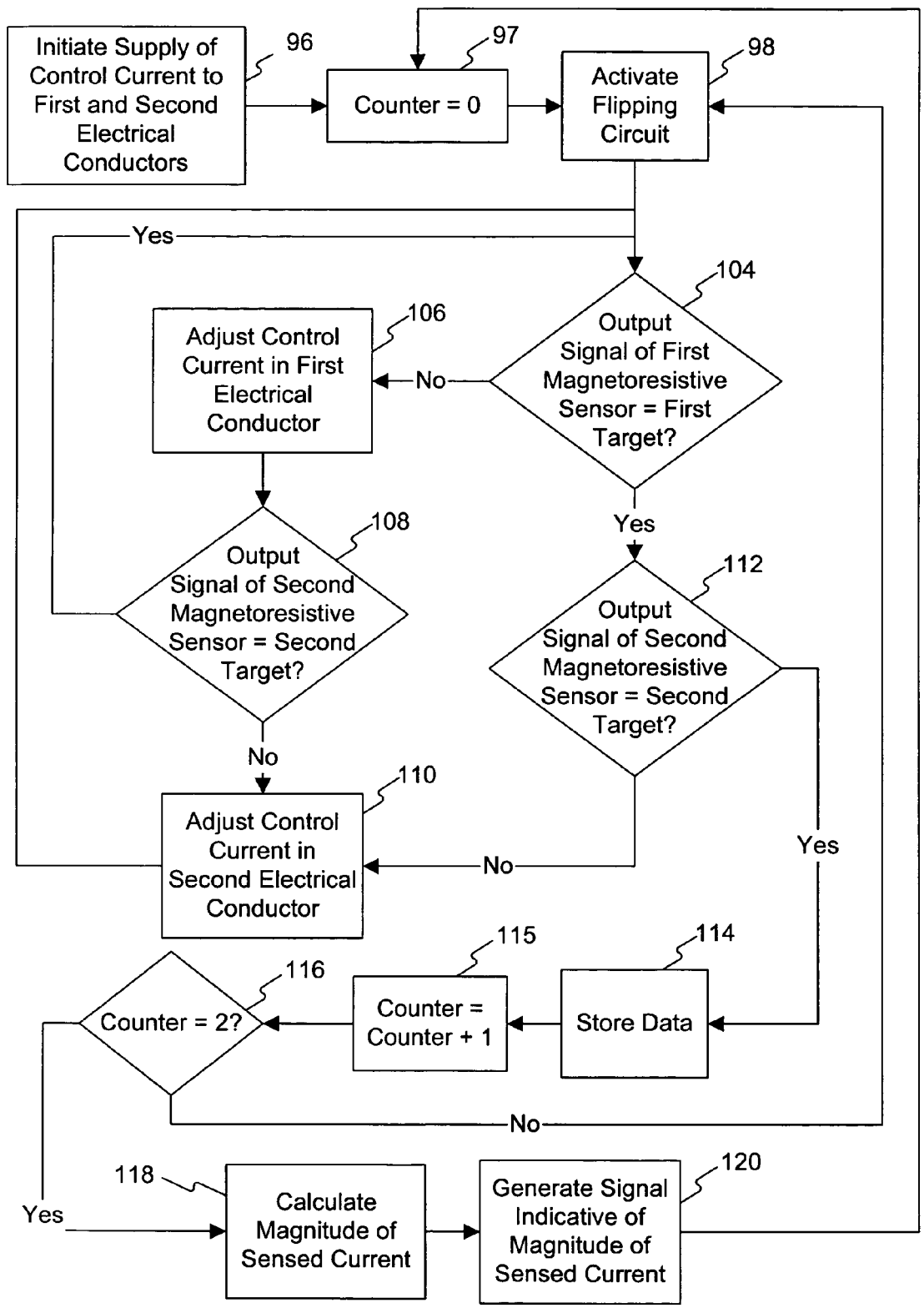
FIG. 6 is a flow chart showing one embodiment of a method of operating the electrical system according to the present disclosure.

Based on inputs from operational amplifiers 64, 66, information processor 70 may control current in electrical conductors 18, 22 and calculate the magnitude of electric current flowing through electrical conductor 12. FIG. 6 shows one embodiment of a method according to which information processor 70 may do so. Initially, information processor 70 may commence supply of control current to electrical conductors 18, 22. (step 96) For example, information processor 70 may begin supplying pulse-width-modulated control voltage to low-pass filters 72, 74, and low-pass filters 72, 74 may convert the control current into DC current and supply it to electrical conductors 18, 22. The control current flowing through electrical conductor 18 may generate control flux 100 (FIG. 5), which may flow through magnetoresistive sensor 14 and affect its output signal. Similarly, the control current in electrical conductor 16 may generate control flux 102 (FIG. 5), which may flow through magnetoresistive sensor 16 and affect its output signal.

Information processor 70 may then set a counter equal to zero. (step 97) Subsequently, information processor 70 may activate flipping circuit 76. (step 98) In response, flipping circuit 76 may cause a pulse of electric current in each electrical conductor 20, 24 having sufficient magnitude to generate a pulse of magnetic flux that reverses the sensitive direction $S_r$ of each magnetoresistor 30-33, 40-43.

Subsequently, information processor 70 may control the magnitude of control current flowing in electrical conductors 18, 22 dependent upon output signals from operational amplifiers 64, 66. Information processor 70 may calculate whether the output signal from magnetoresistive sensor 14 is equal to a first predetermined target. (step 104) Information processor 70 may do so using the output signal of operational amplifier 64 because of the known relationship between the output signal of magnetoresistive sensor 14 and the output signal of operational amplifier 64. The first predetermined target may be a singular target value, such as a value of the output signal of magnetoresistive sensor 14 corresponding to magnetoresistive sensor 14 sensing zero magnetic flux. Alternatively, the first predetermined target may be a target range, in which case the output signal of magnetoresistive sensor 14 may be considered to be equal to the first predetermined target whenever the output signal is within the range. The first predetermined target may have a fixed numerical value/fixed numerical values, or it may be defined as a function of various other factors.

If the output signal of magnetoresistive sensor 14 is not within the first predetermined target, information processor 70 may adjust the supply of control current to electrical conductor 18 to drive the output signal of magnetoresistive sensor 14 toward the first predetermined target. (step 106) In embodiments where information processor 70 delivers pulse-width-modulated voltage to low-pass filter 72, information processor 70 may adjust the control current in electrical conductor 18 by adjusting the duty cycle of the pulse-width-modulated voltage. Adjusting the control current in electrical conductor 18 may change the output signal of magnetoresistive sensor 14 by changing the magnitude of control flux 100 flowing through magnetoresistive sensor 14.

Subsequently, information processor 70 may calculate whether the output signal of magnetoresistive sensor 16 is within a second predetermined target. (step 108) Like the first predetermined target, the second predetermined target may be a singular target value or a target range. Additionally, the first predetermined target may have a fixed numerical value/fixed numerical values, or it may be defined as a function of various other factors.

If the output signal of magnetoresistive sensor 16 is not within the second predetermined target, information processor 70 may adjust the control current in electrical conductor 22 to drive the output signal of magnetoresistive sensor 16 toward the second predetermined target. (step 110)

Information processor 70 may continue adjusting the control current in one or both of electrical conductors 18, 22 until information processor 70 determines that the output signal of magnetoresistive sensor 14 is equal to the first predetermined target (step 104) and the output signal of magnetoresistive sensor 16 is equal to the second predetermined target (step 112). When these conditions are met, information processor 70 may store information relating to the present operating conditions of electrical system 10. (step 114) For example, information processor 70 may store data relating to the control current in electrical conductors 18, 22, such as the duty cycle of the pulse-width-modulated voltage delivered to low-pass filters 72, 74. Additionally, in some embodiments, information processor 70 may store the information relating to the present output signals of magnetoresistive sensors 14, 16 and/or information relating to various other operating conditions of electrical system 10.

Subsequently, information processor 70 may increment the counter (step 115) and calculate whether the counter is equal to two (step 116). If the counter is not equal to two, information processor 70 may repeat the sequence of actions beginning with activating flipping circuit 76 (step 98).

Once information processor 70 has executed this sequence twice, as indicated by information processor 70 determining that the counter is equal to two (step 116), information processor 70 may use stored data from the two cycles to calculate the electric current flowing in electrical conductor 10. (step 118) Information processor 70 may calculate the magnitude of electric current in electrical conductor 12 as a function of various factors using information relating those factors to the magnitude of electric current in electrical conductor 12. For example, information processor 70 may calculate the magnitude of the electric current in electrical conductor 12 as a function of the control currents in electrical conductors 18, 22, the output signals of magnetoresistive sensors 14, 16, and the positions of magnetoresistive sensors 14, 16 with respect to electrical conductor 12. Information processor 70 may employ various algorithms to do so. In embodiments where electrical system 10 does not include adjustable positioning system 122 and/or circumstances wherein control circuit 26 is not causing adjustable positioning system 122 to move magnetoresistive sensors 14, 16, information processor 70 may treat the positions of magnetoresistive sensors 14, 16 as constants.

Similarly, in some embodiments, when calculating the magnitude of electric current in electrical conductor 12, information processor 70 may treat the output signals from magnetoresistive sensors 14, 16 as constants, rather than variables. The exemplary algorithm discussed in detail below takes this approach. Such an approach may provide a particularly accurate estimate of the magnitude of the electric current in electrical conductor 12 in embodiments where the predetermined target for the output signal of each magnetoresistive sensor 14, 16 includes only a single target value or a relatively small range of values.

Information processor 70 may calculate the magnitude of current in electrical conductor 12 in a manner that accounts for other factors that affect the output signals of magnetoresistive sensors 14, 16. One such factor may be variation of magnetoresistors 30-33 from their design specifications. As mentioned above, magnetoresistors 30 and 31 may be designed to have exactly equal default resistance, and magnetoresistors 32 and 33 may be designed to have exactly equal default resistance. If this design goal is actually achieved, intermediate terminals 48, 50 will be at equal voltages when no magnetic flux flows through magnetoresistors 30-33, and any voltage differential between intermediate terminals 48, 50 will be a function of sensed magnetic flux. However, in practice, manufacturing variations will generally cause some unknown amount of imbalance between the default resistances of magnetoresistors 30 and 31 and some unknown imbalance between the default resistances of magnetoresistors 32 and 33. This may cause an unknown voltage difference between intermediate terminals 48, 50 that is not attributable to sensed magnetic flux. This voltage difference is often referred to as "bridge offset." Magnetoresistive sensor 16 may also have bridge offset.

Periodically reversing the sensitive directions $S_r$ of magnetoresistors 30-33, 40-43 may create circumstances that allow information processor 70 to factor out any bridge offset. As long as input terminal 36 receives a constant voltage, any bridge offset will have a constant effect on the output signal of magnetoresistive sensor 14. By contrast, reversing the sensitive directions $S_r$ of magnetoresistors 30-33 reverses the effect of the magnetic flux 92 and 94 on the output signal of magnetoresistive sensor 14. As a result, reversing the sensitive directions $S_r$ of magnetoresistors 30-33 will cause a change in the output signal of magnetoresistive sensor 14 equal to twice the total effect of magnetic fluxes 92 and 94 on the output signal of magnetoresistive sensor 14.

Using this fact and information from before and after reversal of the sensitive directions $S_r$ of magnetoresistors 30-33, 40-43, information processor 70 may employ various algorithms to calculate a value indicative of the net magnetic flux flowing through magnetoresistors 30-33 (the vector sum of magnetic fluxes 92, 94). For example, in some embodiments, information processor 70 may calculate values X1 and X2 related to the net magnetic flux sensed by magnetoresistive sensors 14 and 16, respectively, as follows:

$$X1 = \frac{\Delta DC1}{2} \quad X2 = \frac{\Delta DC2}{2}$$

where $\Delta DC1$ is the difference between the duty cycle of pulse-width-modulated voltage delivered to low-pass filter 72 before reversal of the sensitive directions $S_r$ of magnetoresistors 30-33 and the duty cycle of pulse-width-modulated voltage delivered to low-pass filter 72 after reversal of the sensitive directions $S_r$ of magnetoresistors 30-33; and $\Delta DC2$ is the difference between the duty cycle of pulse-width-modulated voltage delivered to low-pass filter 74 before reversal of the sensitive directions $S_r$ of magnetoresistors 40-43 and the duty cycle of pulse-width-modulated voltage delivered to low-pass filter 74 after reversal of the sensitive directions $S_r$ of magnetoresistors 40-43. Of course, it should be understood that values relating to the magnetic flux sensed by magnetoresistive sensors 14, 16 may be calculated in numerous ways other than the example provided above.

Additionally, receiving information from both magnetoresistive sensor 14 and magnetoresistive sensor 16 may allow information processor 70 to factor out ambient magnetic flux 94 when calculating the magnitude of electric current in electrical conductor 12. As mentioned above, ambient magnetic flux 94 drives the output signals of both magnetoresistive sensors 14, 16 in the same direction, and magnetic flux 92 drives the output signals of magnetoresistive sensors 14, 16 in opposite directions. As a result, the difference between the output signal of magnetoresistive sensor 14 and the output signal of magnetoresistive sensor 16 corresponds to the sum of the effect of magnetic flux 92 on magnetoresistive sensor 14 and the effect of magnetic flux 92 on magnetoresistive sensor 16. Additionally, because magnetoresistive sensors 14, 16 are substantially equidistant from electrical conductor 12, the effect of magnetic flux 92 on the output signal of magnetoresistive sensor 14 may be substantially equal to the effect of magnetic flux 92 on magnetoresistive sensor 16.

Using these facts, information processor 70 may execute various algorithms for calculating the magnitude of electric current in electrical conductor 12 without bias from ambient magnetic flux 94. For example, when calculating the magnitude of electric current in electrical conductor 12, information processor 70 may calculate a value Y relating to the effect of magnetic flux 92 on each magnetoresistive sensor 14, 16 as follows:

$$Y = \frac{\text{Abs}[(X1 - X2)]}{2}$$

where X1 and X2 are the previously calculated values corresponding to the net effect of magnetic flux 92 and ambient magnetic flux 94 on the output signals of magnetoresistive sensors 14, 16, respectively. With knowledge of the effect of magnetic flux 92 on the output signal of each magnetoresistive sensor 14, 16, information processor 70 may use various calibration data to calculate the magnitude of electric current in electrical conductor 12.

After calculating the magnitude of electric current in electrical conductor 12, information processor 70 may generate a signal indicative of the magnitude of the electric current. (step 120) The signal may be an internal signal maintained within information processor 70, or information processor 70 may transmit the signal to another electrical circuit element.

Subsequently, information processor 70 may reset the counter to zero (step 97) and resume the cycle of periodically activating flipping circuit 76 (step 98), adjusting the control currents in electrical conductors 18, 22 as necessary (steps 104, 106, 108, and 110), and storing information relating to operating conditions of electrical system 10 (step 114). As information processor 70 continues to execute the algorithm shown in FIG. 6, information processor 70 may calculate the magnitude of electric current in electrical conductor 12 numerous different times. In some embodiments, information processor 70 may store each calculated value and keep a running average of the calculated values, which may help diminish the effects of noise in the data-gathering process.

Operation of electrical system 10 is not limited to the examples provided in FIG. 6 and the above discussion. For example, control circuit 26 may perform the actions discussed above in different orders than shown in FIG. 6. In some cases, control circuit 26 may perform some of the actions simultaneously. Additionally, control circuit 26 may omit some of the actions discussed above and/or execute various actions not discussed above or shown in FIG. 6.

Control circuit 26 may also execute the actions shown in FIG. 6 with different parameters and/or algorithms than those discussed above. Additionally, control circuit 26 may employ various equations and/or algorithms other than those discussed above to calculate the magnitude of electric current in electrical conductor 12.

Additionally, operation of electrical system 10 may vary from the examples discussed above in embodiments where the physical configuration of electrical system 10 differs from that shown in FIGS. 1-4. For example, in embodiments where electrical system 10 includes multiple electrical conductors in place of electrical conductor 12, control circuit 26 may calculate the aggregate electric current flowing in those electrical conductors and/or generate a signal indicative of the aggregate electric current flowing in those electrical conductors. Similarly, in embodiments where electrical system 10 includes multiple electrical conductors in place of electrical conductor 18 and/or multiple electrical conductors in place of electrical conductor 22, control circuit 26 may coordinate control current in those multiple electrical conductors as necessary to achieve the same results as discussed above. Additionally, various electrical circuit elements other than information processor 70 may perform some or all of the actions discussed above.

The disclosed embodiments may provide a number of performance advantages. Incorporating electrical conductors 18, 20 in monolithic integrated circuit 28 with magnetoresistive sensor 14, as well as incorporating electrical conductors 22, 24 in monolithic integrated circuit 29 with magnetoresistive sensor 16 may provide various benefits. Constructing electrical system 10 in this manner may avoid component cost associated with separately providing electrical conductors 18, 20, 22, 24 and magnetoresistive sensors 14, 16. Additionally, this construction may promote precise location of electrical conductors 18, 20 and electrical conductors 22, 24 with respect to magnetoresistive sensors 14 and 16, respectively, which may facilitate accurate calculation of the current in electrical conductor 12. Furthermore, this construction may enable placing electrical conductors 18, 20 and 22, 24 very close to magnetoresistive sensors 14 and 16, respectively, which may limit the amount of current necessary in electrical conductors 18, 20, 22, 24 to achieve the above-described functions.

Additionally, employing a digital information processor to adjust the control currents in electrical conductors 18, 22, calculate the magnitude of electric current in electrical conductor 12, and generate a signal indicative of the calculated magnitude of the current may provide certain advantages. A digital information processor may be able to calculate the magnitude of the current and generate a signal indicative of the magnitude of the current with very high resolution. Additionally, a digital information processor may be able to generate a signal that may be readily communicated to other digital information processors for use in various monitoring and/or control processes.

Furthermore, the disclosed embodiments may enable accurately sensing a wide range of current in electrical conductor 12. By using control current in electrical conductors 18, 22 to adjust the output signals of magnetoresistive sensors 14, 16 into predetermined targets, control circuit 26 may ensure operation of magnetoresistive sensors 14, 16 in operating ranges wherein they provide reliable output signals. Whenever magnetoresistive sensors 14, 16 are within such operating ranges, the magnitude of electric current in electrical conductor 12 may be accurately calculated as a function of the control currents in electrical conductors 18, 22, the output signals of magnetoresistive sensors 14, 16, and the positions of magnetoresistive sensors 14, 16 with respect to electrical conductor 12. For any one spatial arrangement of electrical system 10, the ability of control circuit 26 to ensure operation of magnetoresistive sensors 14, 16 within such operating ranges is limited only by limits on the ability of control circuit 26 to adjust control fluxes 100, 102 to offset magnetic flux 92 and ambient magnetic flux 94. Accordingly, for any one spatial arrangement of electrical system 10, only the limits of the ability of control circuit 26 to adjust the control currents in electrical conductors 18, 22 limit the range of current that can be accurately sensed.

Additionally, adjustable positioning system 122 may enable tailoring the current-sensing capabilities of electrical system 10 to a wide range of applications and circumstances. For applications and circumstances where the current in electrical conductor 12 is small, magnetoresistive sensors 14, 16 may be positioned relatively close to retainer 27 and electrical conductor 12. For applications and circumstances where the current in electrical conductor 12 is large, magnetoresistive sensors 14, 16 may be positioned relatively far from retainer 27 and electrical conductor 12.

During initial setup of electrical system 10, adjustable positioning system 122 may be used to position magnetoresistive sensors 14, 16 to provide an appropriate current-sensing range for the intended application of electrical system 10. Suitable initial positions may be calculated using knowledge of the range of current that it is desired to accurately sense, the ranges of control fluxes 100, 102 that can be generated, and the reliable operating ranges of magnetoresistive sensors 14, 16. In some cases, the initial positions may be calculated based at least partially upon the expected magnitude of current in electrical conductor 12 during operation. For example, the initial positions of magnetoresistive sensors 14, 16 may be calculated so that the range of current that can be accurately sensed is substantially equal to the expected range of current in electrical conductor 12 during operation.

After appropriate initial positions of magnetoresistive sensors 14, 16 are calculated and adjustable positioning system 122 is used to set those positions, information processor 70 may be calibrated accordingly. For example, various constants that information processor 70 uses to generate a signal relating to the magnitude of current in electrical conductor 12 may be calibrated.

Adjustable positioning system 122 may also be employed to adjust the positions of magnetoresistive sensors 14, 16 for changing circumstances after initial setup of electrical system 10. For example, if the range of current generally carried by electrical conductor 12 changes for any reason, the positions of magnetoresistive sensors 14, 16 may be adjusted, and control circuit 26 may be recalibrated accordingly. Additionally, in embodiments where adjustable positioning system 122 includes one or more movable connections 132 between magnetoresistive sensors 14, 16 and frame 13, the positions of magnetoresistive sensors 14, 16 may be adjusted as desired during operation of electrical system 10. In such circumstances, if control circuit 26 has information about the positions of magnetoresistive sensors 14, 16, control circuit 26 may automatically calibrate for changes in the positions of magnetoresistive sensors 14, 16.

Additionally, in embodiments where control circuit 26 is operatively connected to powered actuator 138 of adjustable positioning system 122, control circuit 26 may control powered actuator 138 to automatically adjust the positions of magnetoresistive sensors 14, 16 to meet various objectives. In some embodiments, control circuit 26 may control the positions of magnetoresistive sensors 14, 16 in concert with the control currents in electrical conductors 18, 22 to cause the output signals of magnetoresistive sensors 14, 16 to substantially coincide with the first and second targets discussed above. For example, if adjustment of the control currents is insufficient to cause the output signals of magnetoresistive sensors 14, 16 to reach the first and second targets, information processor 70 may move magnetoresistive sensors 14, 16 to drive their output signals to the first and second targets. It will of course be understood that adjustable positioning system 122 may be used to adjust the position of magnetoresistive sensors 14, 16 in various circumstances other than those mentioned above to achieve various objectives other than those mentioned above.

It will be apparent to those skilled in the art that various modifications and variations can be made in the electrical system and methods without departing from the scope of the disclosure. Other embodiments of the disclosed electrical system and methods will be apparent to those skilled in the art from consideration of the specification and practice of the electrical system and methods disclosed herein. It is intended that the specification and examples be considered as exemplary only, with a true scope of the disclosure being indicated by the following claims and their equivalents.

What is claimed is:

1. A system for sensing current in one or more first electrical conductors, comprising:
   a frame;
   a retainer configured to receive the one or more first electrical conductors and constrain relative movement between the one or more first electrical conductors and the frame;
   a first magnetoresistive sensor configured to sense magnetic flux and generate an output signal relating to the sensed magnetic flux;

an adjustable positioning system configured to enable supporting the first magnetoresistive sensor from the frame in any of a plurality of possible positions with respect to the retainer; and one or more control current conductors configured to carry control current that generates control flux, wherein the control flux is sensed by the first magnetoresistive sensor; and a control circuit configured to receive the output signal of the first magnetoresistive sensor and to cause the output signal of the first magnetoresistive sensor to substantially coincide with a predetermined target at least partially by controlling the control current.

2. The system of claim 1, wherein the adjustable positioning system is configured to enable supporting the first magnetoresistive sensor in at least one of the plurality of possible positions with at least one spacer mounted between the first magnetoresistive sensor and the frame.

3. The system of claim 1, wherein the adjustable positioning system includes one or more movable connections between the first magnetoresistive sensor and the frame.

4. The system of claim 1, wherein the adjustable positioning system includes a rack and pinion with an electric motor drivingly connected to the pinion.

5. The system of claim 1, wherein the adjustable positioning system includes a powered actuator operable when activated to adjust the position of the first magnetoresistive sensor with respect to the retainer.

6. The system of claim 5, further including a control circuit configured to receive the output signal of the first magnetoresistive sensor and to cause the output signal of the first magnetoresistive sensor to substantially coincide with a predetermined target at least partially by controlling the powered actuator.

7. The system of claim 5, further including:
one or more control current conductors configured to carry control current that generates control flux, wherein the control flux is sensed by the first magnetoresistive sensor;
a control circuit configured to receive the output signal of the first magnetoresistive sensor and to cause the output signal of the first magnetoresistive sensor to substantially coincide with a predetermined target at least partially by controlling the control current and the powered actuator.

8. The system of claim 1, wherein the first magnetoresistive sensor and the one or more control current conductors are part of a monolithic integrated circuit.

9. The system of claim 1, further including:
a second magnetoresistive sensor configured to sense magnetic flux and produce an output signal relating to the sensed magnetic flux; and
wherein the first magnetoresistive sensor and the second magnetoresistive sensor are substantially equidistant from the retainer.

10. The system of claim 1, wherein the first magnetoresistive sensor and the one or more control current conductors are part of a monolithic integrated circuit.

11. A method of sensing current in one or more first electrical conductors, comprising:
supporting a first magnetoresistive sensor from a frame, wherein supporting the first magnetoresistive sensor from the frame includes using an adjustable positioning system to locate the first magnetoresistive sensor in one of a plurality of possible positions with respect to the frame;
constraining relative movement between the one or more first electrical conductors and the frame;
using the first magnetoresistive sensor to sense magnetic flux and generate an output signal relating to the sensed magnetic flux, including using the first magnetoresistive sensor to sense magnetic flux generated by current in the one or more first electrical conductors; and
prior to using the adjustable positioning system to locate the first magnetoresistive sensor in one of the plurality of possible positions, determining which position to locate the first magnetoresistive sensor in based at least partially on an expected magnitude of current in the one or more first electrical conductors.

12. The method of claim 11, further including:
calibrating a control circuit based at least partially upon the position of the first magnetoresistive sensor; and
using the control circuit to receive the output signal of the first magnetoresistive sensor and generate a signal relating to the magnitude of current in the one or more first electrical conductors.

13. The method of claim 11, further including causing the output signal of the first magnetoresistive sensor to substantially coincide with a predetermined target at least partially by using the adjustable positioning system to adjust the position of the first magnetoresistive sensor.

14. The method of claim 11, wherein using the adjustable positioning system to locate the first magnetoresistive sensor in one of the plurality of possible positions includes mounting a combination of one or more spacers between the frame and the first magnetoresistive sensor.

15. The method of claim 11, wherein using the adjustable positioning system to locate the first magnetoresistive sensor in one of the plurality of possible positions includes operating a powered actuator of the adjustable positioning system to adjust the position of the first magnetoresistive sensor.

16. The method of claim 15, further including:
supplying control current to one or more control current conductors, thereby generating control flux, wherein the first magnetoresistive sensor is operable to sense the control flux; and
causing the output signal of the first magnetoresistive sensor to substantially coincide with a predetermined target at least partially by controlling the control current and the powered actuator.

17. The method of claim 11, wherein using the adjustable positioning system to locate the first magnetoresistive sensor in one of the plurality of possible positions includes operating an electric motor of the adjustable positioning system to drive a rack and pinion of the adjustable positioning system.

18. The method of claim 11, further including:
supplying control current to one or more control current conductors, thereby generating control flux, wherein the first magnetoresistive sensor is operable to sense the control flux; and
causing the output signal of the first magnetoresistive sensor to substantially coincide with a predetermined target at least partially by controlling the control current.

19. The method of claim 18, further including:
calibrating a control circuit based at least partially upon the position of the first magnetoresistive sensor.

20. The method of claim 19, further including:
supplying the output signal of the first magnetoresistive sensor to an electrical circuit; and
operating the electrical circuit in a manner that takes into account the position of the first magnetoresistive sensor relative to the one or more first electrical conductors.

21. The method of claim 11, further including:
using a second magnetoresistive sensor to sense magnetic flux, including magnetic flux generated by current in the one or more first electrical conductors, the second magnetoresistive sensor and the first magnetoresistive sensor being disposed substantially equidistant from the one or more first electrical conductors.

22. The method of claim 11, further including:
supplying control current to one or more control current conductors, thereby generating control flux, wherein the first magnetoresistive sensor is operable to sense the control flux.

23. The method of claim 22, further including:
adjusting the control current based at least in part on the output signal of the first magnetoresistive sensor.

24. The method of claim 11, further including:
calibrating a control circuit based at least partially upon the position of the first magnetoresistive sensor.

25. The method of claim 24, further including:
supplying the output signal of the first magnetoresistive sensor to an electrical circuit; and
operating the electrical circuit in a manner that takes into account the position of the first magnetoresistive sensor relative to the one or more first electrical conductors.

26. The method of claim 11, further including:
supplying the output signal of the first magnetoresistive sensor to an electrical circuit; and
operating the electrical circuit in a manner that takes into account the position of the first magnetoresistive sensor relative to the one or more first electrical conductors.

27. A method of sensing current in one or more first electrical conductors, comprising:
supporting a first magnetoresistive sensor from a frame, wherein supporting the first magnetoresistive sensor from the frame includes using an adjustable positioning system to locate the first magnetoresistive sensor in one of a plurality of possible positions with respect to the frame;
constraining relative movement between the one or more first electrical conductors and the frame;
using the first magnetoresistive sensor to sense magnetic flux and generate an output signal relating to the sensed magnetic flux, including using the first magnetoresistive sensor to sense magnetic flux generated by current in the one or more first electrical conductors; and
calibrating a control circuit based at least partially upon the position of the first magnetoresistive sensor.

28. The method of claim 27, further including:
supplying control current to one or more control current conductors, thereby generating control flux, wherein the first magnetoresistive sensor is operable to sense the control flux; and
causing the output signal of the first magnetoresistive sensor to substantially coincide with a predetermined target at least partially by controlling the control current.

29. The method of claim 28, further including:
supplying the output signal of the first magnetoresistive sensor to an electrical circuit; and
operating the electrical circuit in a manner that takes into account the position of the first magnetoresistive sensor relative to the one or more first electrical conductors.

30. A method of sensing current in one or more first electrical conductors, comprising:
supporting a first magnetoresistive sensor from a frame, wherein supporting the first magnetoresistive sensor from the frame includes using an adjustable positioning system to locate the first magnetoresistive sensor in one of a plurality of possible positions with respect to the frame;
constraining relative movement between the one or more first electrical conductors and the frame;
using the first magnetoresistive sensor to sense magnetic flux and generate an output signal relating to the sensed magnetic flux, including using the first magnetoresistive sensor to sense magnetic flux generated by current in the one or more first electrical conductors;
supplying the output signal of the first magnetoresistive sensor to an electrical circuit; and
operating the electrical circuit in a manner that takes into account the position of the first magnetoresistive sensor relative to the one or more first electrical conductors.

31. The method of claim 30, further including:
supplying control current to one or more control current conductors, thereby generating control flux, wherein the first magnetoresistive sensor is operable to sense the control flux; and
causing the output signal of the first magnetoresistive sensor to substantially coincide with a predetermined target at least partially by controlling the control current.

32. The method of claim 30, further including:
calibrating a control circuit based at least partially upon the position of the first magnetoresistive sensor.

* * * * *